United States Patent [19]

Wu et al.

[11] Patent Number: 5,275,971
[45] Date of Patent: Jan. 4, 1994

[54] METHOD OF FORMING AN OHMIC CONTACT TO III-V SEMICONDUCTOR MATERIALS

[75] Inventors: Schyi-Yi Wu, Mesa; Hang M. Liaw, Scottsdale; Curtis D. Moyer, Phoenix; Steven A. Voight, Gilbert; Israel A. Lesk, Phoenix, all of Ariz.

[73] Assignee: Motorola, Inc., Schaumburg, Ill.

[21] Appl. No.: 871,785

[22] Filed: Apr. 20, 1992

[51] Int. Cl.$^5$ ............... H01L 21/441; H01L 21/324
[52] U.S. Cl. ................... 437/184; 437/192; 437/202; 437/247; 148/DIG. 20
[58] Field of Search ............ 437/184, 192, 247, 202; 148/DIG. 16; 20

[56] References Cited

PUBLICATIONS

DuBon Chevalier et al. "GeMoW Refractory Ohmic Contact...", *J. Electrochem Soc.*, vol. 137, No. 5, May 1990, pp. 1514–1519.
Marshall et al, "Planar Ge/Pd Au Alloyed Au-Ge-Ni...", *Appl Phys Lett*, 54(8), Feb. 20, 1989, pp. 721–723.
Yu et al, "The Temperature Dependence of Contact Resistivity...", *J Appl Phys*, 65(4), Feb. 15, 1989, pp. 1621–1625.

*Primary Examiner*—John S. Maples
*Attorney, Agent, or Firm*—Miriam Jackson

[57] ABSTRACT

An ohmic contact to a III-V semiconductor material is fabricated. First, a III-V semiconductor material is provided. Source/drain regions are then formed in the III-V semiconductor material. On the III-V semiconductor material, a contact system is formed which is dry etchable using reactive ions such as chlorine or fluorine and substantially free of arsenic. Subsequently, a portion of the contact system is dry etched using reactive ions such as chlorine or fluorine to leave a portion of the contact system remaining on the source/drain regions. Then, the III-V semiconductor material and the contact system are annealed in an atmosphere substantially free of arsenic at a temperature at which at least a part of the contact system is alloyed with the source/drain regions to form an ohmic contact with the source/drain regions of the III-V semiconductor material.

22 Claims, 2 Drawing Sheets

METHOD OF FORMING AN OHMIC CONTACT TO III-V SEMICONDUCTOR MATERIALS

BACKGROUND OF THE INVENTION

This invention relates, in general, to a method of forming ohmic contacts to III-V semiconductor materials, including, but not limited to, a thermally stable ohmic contact for III-V semiconductor materials.

Ohmic contact is made to III-V semiconductor materials with various contact systems. A nickel, germanium and gold (Ni/Ge/Au) or a gold, zinc and gold (Au/Zn/Au) system has been used in the past. These gold containing systems require the use of photolithography lift-off techniques, because gold is not dry etchable (etchable with reactive ions, rather than wet chemicals) using reactive ions such as chlorine (Cl−) or fluorine (F−). It would be desirable to use dry etching in processing the contact system in order to be able to use a self-aligned gate fabrication process and to scale down the size of the semiconductor devices.

Another contact system to III-V semiconductor materials used in the past is comprised of palladium and germanium (Pd/Ge). This system also has its disadvantages because the contact resistivity is not thermally stable at temperatures above 500° C. Therefore if the contact system is exposed to such temperatures, the contact resistance increases, and degrades the gain of the transistor. In certain steps of fabricating semiconductor devices in III-V semiconductor material, it is necessary to expose the device to temperatures above 500° C., therefore it would be desirable to have a contact system which is thermally stable above that temperature.

Yet another contact system to III-V semiconductor materials used in the past is comprised of germanium, molybdenum and tungsten (Ge/Mo/W). This contact system is dry etchable and thermally stable, however, it exhibits nonohmic behavior. To make this system ohmic, arsenic must be used in the annealing ambient or must be introduced into Ge directly (which forms Ge-(As)/Mo/W). The use of arsenic in these processes is highly undesirable due to the toxicity of arsenic. Thus, it is necessary to come up with an ohmic contact to III-V semiconductor materials which does not use arsenic in the process of fabricating it.

SUMMARY OF THE INVENTION

An ohmic contact to a III-V semiconductor material is fabricated. The method comprises the steps of: providing a III-V semiconductor material having source/drain regions therein, forming a contact system on the III-V semiconductor material which is dry etchable using reactive ions such as Cl− or F$^{31}$ and is substantially free of arsenic, then dry etching a portion of the contact system using reactive ions such as Cl− or F− to leave at least a portion of the contact system on the source/drain regions, and annealing the III-V semiconductor material and the contact system in an atmosphere substantially free of arsenic at a temperature at which at least a part of the contact system is alloyed with the III-V semiconductor material to form a thermally stable ohmic contact with the source/drain regions of the III-V semiconductor material.

DETAILED DESCRIPTION OF THE DRAWINGS

Figure 1:
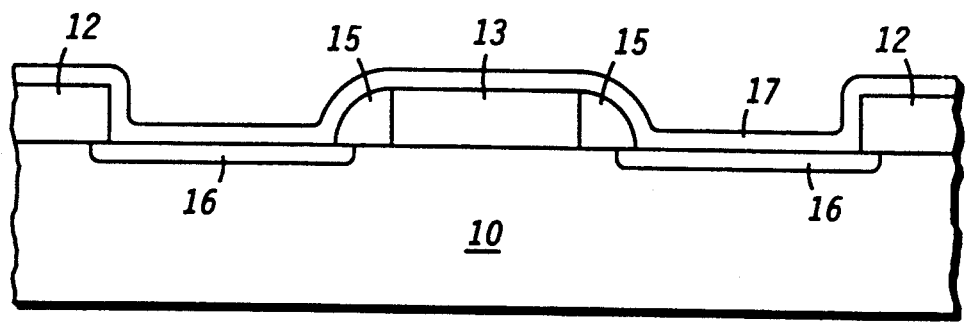
FIG. 1 illustrates an enlarged, cross-sectional view of an embodiment of the present invention in a first stage of fabrication.

FIG. 1 illustrates an enlarged cross-sectional view of a portion of an embodiment of the present invention in a first stage of processing. First, a semi-insulating, p-type or n-type III-V semiconductor material 10, which may be a substrate or an epitaxial layer, is provided. III-V semiconductor material 10 may be comprised of, for example, gallium arsenide (GaAs), aluminum gallium arsenide (AlGaAs), indium arsenide (InAs), or indium gallium aluminum phosphide (InGaAlP). Other suitable III-V semiconductor materials may be used. A field oxide layer 12 is then formed on III-V semiconductor material 10. Subsequently, a gate region is formed on III-V semiconductor material 10. The gate region is comprised of a Schottky gate metallization system 13 and spacers 15. Gate metallization system is comprised of titanium, tungsten and nitrogen (TiWN), or other suitable metallization. Source/drain regions 16 are formed in III-V semiconductor material 10 where field oxide 12 and gate metallization system 13 and spacers 15 are not disposed. Source/drain regions 16 may be formed, for example by ion implantation of silicon into III-V semiconductor material 10. The process of forming source/drain regions 16 is well known in the art.

A contact system 17 is then formed on the exposed areas of III-V semiconductor material 10, on field oxide 12, on spacers 15 and on gate metallization system 13. Contact system 17 of the present invention is comprised of a metallization layer and/or a semiconductive layer which are dry etchable using reactive ions such as Cl− or F−, has thermally stable contact resistivity at temperatures above 500° C. after alloying, exhibits ohmic properties, and is substantially free of arsenic.

Metallization layers or semiconductive layers which are dry etchable using reactive ions such as Cl− or F− are those that form volatile compounds with Cl or F. For example, titanium (Ti), tungsten (W), germanium (Ge), molybdenum (Mo), an alloy of any of the previously listed elements and an alloy of titanium-tungsten-nitrogen (TiWN) with one of the previously listed elements, or any combination thereof are dry etchable. Elements such as gold and nickel are not dry etchable because they do not form volatile compounds with fluorine or chlorine.

Contact system 17 with thermally stable contact resistivity is a system with contact resistivity that does not change unacceptably when subjected to temperatures up to approximately 500° C. to 600° C. for approximately one hour. Elements such as Ti, W, Ge, Mo, an alloy of any of the previous elements and an alloy of TiWN, or any combination thereof are thermally stable at this temperature when used as ohmic contacts to III-V semiconductor materials. An element such as Pd is not, because the alloys or compounds formed as a result of annealing are not thermally stable. Contact systems that do not form thermally stable contacts to III-V semiconductor materials melt, decompose, react excessively or diffuse too deeply when subjected to temperatures up to approximately 500° C. to 600° C. for approximately one hour.

Contact system 17 which has ohmic properties is a system in which the stoichiometry and the doping level of the semiconductor material surface are properly maintained. For example, contact system 17 comprised of Ge/Mo/W exhibits nonohmic properties due to too much Ge consumption (as a result of $Mo_{13}Ge_{23}$ formation), which limits the availability of Ge, which in this case is necessary for doping a III-V semiconductor material to lower contact resistance. In addition, if semiconductor material 10 is comprised of n-type GaAs, too much As can outdiffuse, making Ge occupy arsenic sites in the lattice of semiconductor material 10. The Ge becomes an acceptor which is not desirable for n-type contacts.

Contact system 17 which is substantially free of arsenic as deposited is desirable because arsenic is so toxic. Contact system 17 comprised of Ge/Mo/W must be doped with arsenic in the Ge layer or must be annealed with arsenic over-pressure (with arsenic present) for it to exhibit ohmic properties. Contact system 17 of the present invention can be fabricated without introducing any arsenic therein, while still exhibiting ohmic properties.

Figure 2:
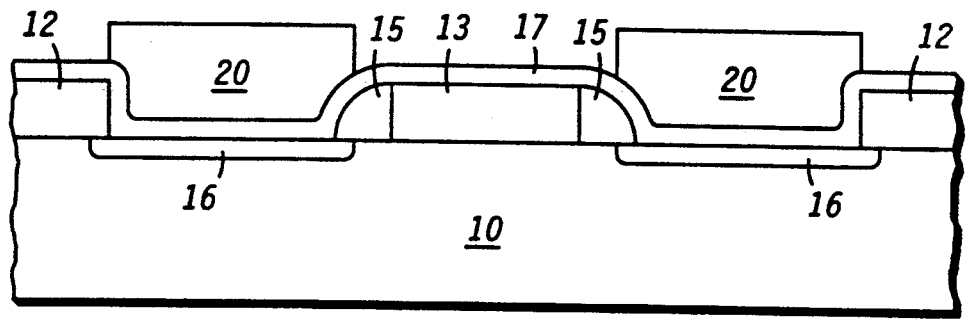
FIG. 2 illustrates an enlarged, cross-sectional view of an embodiment of the present invention shown in FIG. 1 in a subsequent stage of fabrication.

FIG. 2 illustrates the structure of FIG. 1 in a subsequent step of processing. A masking layer 20 is formed and patterned on the surface of contact system 17. Masking layer 20 is left remaining over the areas where contact system 17 is disposed on III-V semiconductor layer 10. The processing of masking layers is well known in the art. Masking layer 20 is preferably a photoresist layer.

Figure 3:
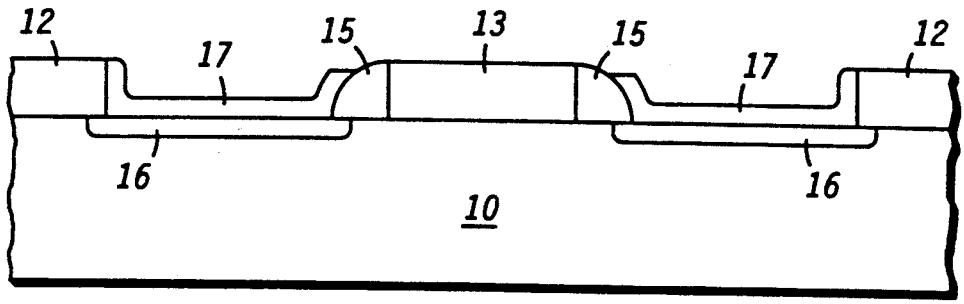
FIG. 3 illustrates an enlarged, cross-sectional view of an embodiment of the present invention shown in FIG. 2 in a subsequent stage of fabrication.

FIG. 3 illustrates the structure of FIG. 2 in a subsequent step of processing. A portion of contact system 17 where masking layer 20 is not disposed is dry etched using reactive ions such as $Cl^-$ or $F^-$. After the remaining portion of masking layer 20 is removed, the structure of FIG. 3 is annealed at a temperature and time at which at least a part of contact system 17 alloys with III-V semiconductor material 10 to form ohmic contacts with source/drain regions 16. For example, if contact system 17 is comprised of Ge/TiW, having a germanium thickness of approximately 150 Angstroms and III-V semiconductor material 10 is comprised of $Al_{0.75}Ga_{0.25}As$, then the temperature at which alloying takes place is approximately 800–850° C. for approximately 2 minutes.

In a preferred embodiment, contact system 17 is comprised of Ge/TiW, with Ge being directly deposited on III-V semiconductor material 10. This is preferable because Ge provides good adhesion and additional doping to III-V semiconductor material 10, while TiW alloys well with III-V semiconductor material 10. If III-V semiconductor material 10 is comprised of Al-GaAs, a high bandgap material, Ti and W react with the Al, thus reducing the amount of Al present in the Al-GaAs. The reduction in the amount of Al present in AlGaAs lowers the bandgap of the material, which translates into lowering the contact resistivity of the ohmic contact. Devices were fabricated with contact resistivities in the range of approximately $3 \times 10^{-5}$ $\Omega-cm^2$ with III-V semiconductor material 10 comprised of 1600 $\Omega$/square n-type $Al_{0.75}Ga_{0.25}As$ and contact system 17 comprised of Ge/TiW annealed at 850° C. for 2 minutes. Lower contact resistivity may be obtained by adjustment of layer compositions and thicknesses.

If III-V semiconductor material 10 is comprised of GaAs, ohmic contact to it can still be made because it has a lower bandgap and a lower contact resistivity than AlGaAs. The thickness of each layer in the contact system 17 is optimized accordingly. If Ge/TiW is used, the preferred thicknesses are optimized so that its formation and processing thereof are manufacturable. For example, Ge having a thickness approximately greater than or equal to 100 Angstroms and TiW having a thickness approximately greater than or equal to 200 Angstroms can be used. Contact system 17 is preferably formed by sputtering, however, contact system 17 may also be formed by evaporation.

Figure 4:
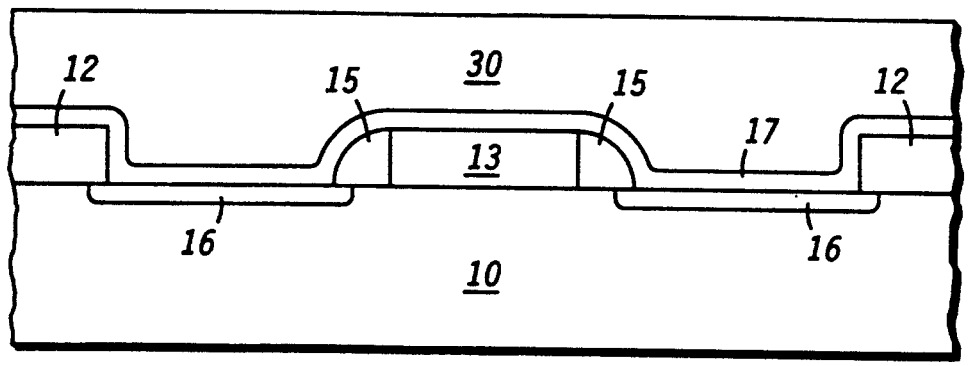
FIG. 4 illustrates an enlarged, cross-sectional view of an embodiment of the present invention shown in FIG. 1 in a second stage of fabrication.
Figure 5:
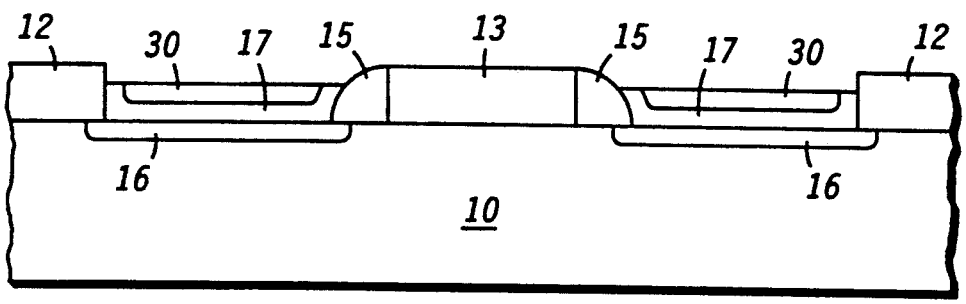
FIG. 5 illustrates an enlarged, cross-sectional view of an embodiment of the present invention shown in FIG. 4 in a subsequent stage of fabrication.
Figure 6:
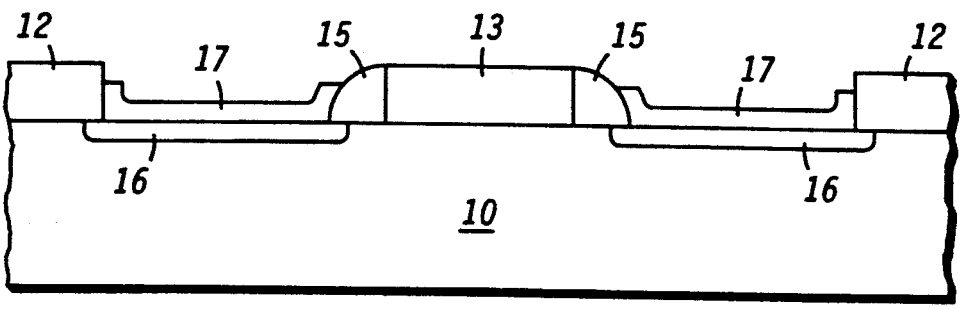
FIG. 6 illustrates an enlarged, cross-sectional view of an embodiment of the present invention shown in FIG. 5 in a subsequent stage of fabrication.

FIGS. 4 through 6 illustrate a second embodiment of the present invention in various stages of fabrication. FIG. 4 illustrates the structure of FIG. 1 in a subsequent step of processing (different from the processing steps shown in FIGS. 2 through 3). First, a planarized masking layer 30 is formed on the surface of contact system 17. The method of providing planarized masking layers is well known in the art. The masking layer is preferably comprised of a photoresist layer.

FIG. 5 illustrates the structure of FIG. 4 further along in processing. A portion of planarized masking layer 30 and a portion of contact system 17 are removed by dry etching using reactive ions such as $Cl^-$ or $F^-$ and oxygen ($O^-$). Enough of contact system 17 is etched such that it is left remaining primarily over source/drain regions 16.

FIG. 6 illustrates the structure of FIG. 5 further along in processing. The remaining portion of planarized masking layer 30 is removed. This may be accomplished by dry etching in an oxygen chemistry or by wet etching in the appropriate solvents. This structure is substantially the same as the structure shown in FIG. 3. This structure is then also annealed as is described with reference to FIG. 3. In both embodiments, annealing may be done before the step of removing a portion of contact system 17.

As can be seen, a process for forming ohmic contacts to a III-V semiconductor material has been shown. The ohmic contact of the present invention is thermally stable, can be dry etched using reactive ions such as fluorine or chlorine, and does not require the use of arsenic to make it ohmic. Because the ohmic contact of the present invention is dry etchable, a lift-off process does not have to be used. A self-aligned process of forming ohmic contacts to source/drain regions of a semiconductor device can be used. The self-aligned process allows for the devices to be scaled down and allows for the production of devices with superior electrical characteristics than devices fabricated with a lift-off process.

We claim:

1. A method of forming an ohmic contact to a III-V semiconductor material, comprising the steps of:

providing a III-V semiconductor material;

forming source/drain regions in the III-V semiconductor material;

forming a contact system which is dry etchable and substantially free of arsenic on the III-V semiconductor material;

dry etching a portion of the contact system using reactive ions to leave at least a portion of the contact system on the source/drain regions; and annealing the III-V semiconductor material and the contact system in an atmosphere substantially free of arsenic at a temperature at which at least a part of the contact system is alloyed with the III-V semiconductor material to form a thermally stable ohmic contact with the source/drain regions of the III-V semiconductor material.

2. The method of claim 1 wherein the step of forming the contact system comprises forming the contact system comprised of titanium.

3. The method of claim 1 wherein the step of forming the contact system comprises forming the contact system comprised of tungsten.

4. The method of claim 1 wherein the step of forming the contact system comprises forming the contact system comprised of germanium.

5. The method of claim 1 wherein the step of forming the contact system comprises forming the contact system comprised of germanium, t and tungsten.

6. The method of claim 1 wherein the step of forming the contact system comprises forming the contact system comprised of germanium having a thickness approximately greater than or equal to 100 Angstroms and a titanium and tungsten alloy having a thickness approximately greater than or equal to 200 Angstroms.

7. The method of claim 1 wherein the step of forming the III-V semiconductor material comprises forming the III-V semiconductor material comprised of aluminum-gallium-arsenide.

8. A method of forming an ohmic contact to a III-V semiconductor material, comprising the steps of:

providing a III-V semiconductor material;

forming source/drain regions in the III-V semiconductor material;

forming a contact system which is dry etchable using reactive ions and substantially free of arsenic on the III-V semiconductor material;

forming a masking layer on a portion of the contact system;

dry etching a portion of the contact system not covered by the masking layer using reactive ions to leave at least a portion of the contact system on the source/drain regions; and annealing the III-V semiconductor material and the contact system in an atmosphere substantially free of arsenic at a temperature at which at least a part of the contact system is alloyed with the III-V semiconductor material to form a thermally stable ohmic contact with the source/drain regions of the III-V semiconductor material.

9. The method of claim 8 wherein the step of forming the contact system comprises forming the contact system comprised of titanium.

10. The method of claim 8 wherein the step of forming the contact system comprises forming the contact system comprised of tungsten.

11. The method of claim 8 wherein the step of forming the contact system comprises the contact system comprised of germanium.

12. The method of claim 8 wherein the step of forming the contact system comprises forming the contact system comprised of germanium having a thickness approximately greater than or equal to 100 Angstroms and a titanium and tungsten alloy having a thickness approximately greater than or equal to 200 Angstroms.

13. The method of claim 8 wherein the step of forming the III-V semiconductor material comprises forming the III-V semiconductor material comprised of aluminum-gallium-arsenide.

14. A method of forming an ohmic contact to a III-V semiconductor material, comprising the steps of:

providing a III-V semiconductor material;

forming source/drain regions in the III-V semiconductor material;

forming a contact system which is dry etchable using reactive ions and substantially free of arsenic on the III-V semiconductor material;

forming a planarized masking layer over the contact system;

dry etching a portion of the planarized masking layer and a portion of the contact system using reactive ions to leave at least a portion of the contact system on the source/drain regions;

removing any remaining planarized masking layer; and annealing the III-V semiconductor material and the contact system in an atmosphere substantially free of arsenic at a temperature at which at least a part of the contact system is alloyed with the III-V semiconductor material to form a thermally stable ohmic contact with the source/drain regions of the III-V semiconductor material.

15. The method of claim 14 wherein the step of forming the contact system comprises forming the contact system comprised of titanium.

16. The method of claim 14 wherein the step of forming the contact system comprises forming the contact system comprised of tungsten.

17. The method of claim 14 wherein the step of forming the contact system comprises forming the contact system comprised of germanium.

18. The method of claim 14 wherein the step of forming the contact system comprises forming the contact system comprised of germanium having a thickness approximately greater than or equal to 100 Angstroms and a titanium and tungsten alloy having a thickness approximately greater than or equal to 200 Angstroms.

19. The method of claim 14 wherein the step of forming the III-V semiconductor material comprises forming the III-V semiconductor material comprised of aluminum-gallium-arsenide.

20. The method of claim 1 wherein the step of dry etching comprises dry etching with chlorine or fluorine reactive ions.

21. The method of claim 8 wherein the step of dry etching comprises dry etching with chlorine or fluorine reactive ions.

22. The method of claim 14 wherein the step of dry etching comprises dry etching with chlorine or fluorine reactive ions.

* * * * *

UNITED STATES PATENT AND TRADEMARK OFFICE
CERTIFICATE OF CORRECTION

PATENT NO. : 5,275,971
DATED : January 4, 1994
INVENTOR(S) : Wu et al.

It is certified that error appears in the above-indentified patent and that said Letters Patent is hereby corrected as shown below:

Claim 5, column 5, line 28, delete "germanium, t and" and insert therefor --germanium, titanium and--.

Claim 11, column 6, line 2, delete "comprises the" and insert therefor --comprises forming the--.

Signed and Sealed this

Eighth Day of November, 1994

Attest:

BRUCE LEHMAN

Attesting Officer

Commissioner of Patents and Trademarks